(12) United States Patent
Lin et al.

(10) Patent No.: US 6,653,029 B2
(45) Date of Patent: Nov. 25, 2003

(54) DUAL-FOCUSED ION BEAMS FOR SEMICONDUCTOR IMAGE SCANNING AND MASK REPAIR

(75) Inventors: Chuan-Yuan Lin, Taipei (TW); Chang-Cheng Hung, Hsin-Chu (TW); Chih Cheng Chin, Taipei (TW); Chin Hsiang Lin, Mai-Nung (TW)

(73) Assignee: Taiwan Semiconductor Manufacturing Co. Ltd., Hsin Chu (TW)

( * ) Notice: Subject to any disclaimer, the term of this patent is extended or adjusted under 35 U.S.C. 154(b) by 132 days.

(21) Appl. No.: 09/927,929

(22) Filed: Aug. 10, 2001

(65) Prior Publication Data

US 2003/0031961 A1 Feb. 13, 2003

(51) Int. Cl.[7] .............................. G03F 9/00; G03F 7/26
(52) U.S. Cl. .................... 430/5; 430/311; 250/492.21
(58) Field of Search ............................ 430/5, 311, 313, 430/315, 320, 322, 323, 324, 325, 327; 204/192.34; 216/66; 250/492.21

(56) References Cited

U.S. PATENT DOCUMENTS

| | | | | |
|---|---|---|---|---|
| 6,190,836 B1 | * | 2/2001 | Grenon | 430/311 |
| 6,335,129 B1 | * | 1/2002 | Asano | 430/5 |
| 2002/0076654 A1 | * | 6/2002 | Hasegawa | 430/311 |

\* cited by examiner

*Primary Examiner*—Kathleen Duda
(74) *Attorney, Agent, or Firm*—Tung & Associates

(57) ABSTRACT

The use of dual-focused ion beams for semiconductor image scanning and mask repair is disclosed. A mask is imaged with either a focused negative ion beam, such as a focused oxygen ion beam, or a focused positive ion beam, such as a focused gallium ion beam. Mask imaging is also referred to as image scanning. Defects in the mask are repaired with the ion beam not used in imaging of the mask. Also disclosed is image scanning being performed with the focused negative ion beam to neutralize potential charge buildup, and mask repair being performed with the focused positive ion beam. An apparatus is disclosed that has a negative ion mechanism supplying negative ions, a positive ion mechanism supplying positive ions, a filter to select the desired ratio of the negative to the positive ions, and an aiming mechanism to focus the ions onto the mask.

15 Claims, 8 Drawing Sheets

DUAL-FOCUSED ION BEAMS FOR SEMICONDUCTOR IMAGE SCANNING AND MASK REPAIR

FIELD OF THE INVENTION

This invention relates generally to photomask scanning and repair in semiconductor processing, and more particularly to the use of dual-focused ion beams for such scanning and repair.

BACKGROUND OF THE INVENTION

Deposition and patterning are two of the basic steps performed in semiconductor processing. Patterning is also referred to as photolithography, masking, oxide or metal removal, and microlithography. Patterning enables the selective removal of material deposited on a semiconductor substrate, or wafer, as a result of deposition. The process of adding layers and removing selective parts of them, in conjunction with other processes, permits the fabrication of semiconductor devices.

This is shown by reference to FIGS. 1A–1D. In FIG. 1A, a layer 104 has been deposited on a semiconductor substrate 102. A layer of photoresist 106 is over the layer 104. A mask 108 is positioned over the photoresist 106, and has opaque regions 110 and 112. The base of the mask 108 is itself clear, and made out of glass. The opaque regions 110 and 112 of the mask 108 are formed out of chromium. Exposure involves the application of ultraviolet rays 114. The parts of the photoresist 106 that are not underneath the opaque regions 110 and 112 are exposed to the ultraviolet rays 114, and become polymerized as the photoresist 106'. The parts of the photoresist 106 underneath the regions 110 and 112 are not exposed to the rays 114, and remain unpolymerized.

In FIG. 1B, the polymerized photoresist 106' is developed, which removes the photoresist 106', leaving only the unpolymerized photoresist 106. The unpolymerized photoresist 106 has a pattern that corresponds to the opaque regions 110 and 112 of the mask 108 of FIG. 1A. In FIG. 1C, the layer 104 is etched to the substrate 102, such that the only part of the layer 104 that remains is that which is under the unpolymerized photoresist 106. This results in two stacks, a stack 116 and a stack 118. Finally, in FIG. 1D, the remaining photoresist 106 is stripped, leaving the stacks 116 and 118 of the layer 104 on the substrate 102.

The accuracy of the mask 108 is crucial for ensuring that the semiconductor devices formed are also accurate, and perform correctly. Defects in a photomask in particular can cause the semiconductor devices fabricated with the photomask to malfunction. Two common defects are shown in FIGS. 2A and 2B. In FIG. 2A, the mask 202 has a proper opaque region 204, but an improper opaque spot 206. Conversely, in FIG. 2B, the opaque region 210 of the mask 208 has an improper hole 212. Other common mask defects include inclusions of opacity into a clear region, protrusions of clarity into an opaque region, clear breaks within opaque regions, and opaque bridges between one opaque region and another opaque region.

Clear or missing parts of a mask are typically repaired by "patching" them with a carbon deposit. Opaque or unwanted chrome regions are usually removed by sputtering from a focused ion beam (FIB). One type of focused ion beam is a gallium ion beam. A focused gallium ion beam is capable of milling away opaque defects and depositing carbon film for clear defects at desired locations. The gallium ion beam may be used to help form the opaque regions on a clear mask, as well as to repair opaque and clear defects on the formed mask. The gallium ion beam is a positive ion beam, since gallium ions are themselves positive ions.

FIG. 3 shows a method 300 of the overall conventional approach that uses a gallium ion beam or other focused positive ion beam. First, the mask image is scanned using the positive ion beam to form the mask (302). This is also generally referred to as mask imaging or image scanning. Second, any defects in the mask are repaired, also with the positive ion beam (304). A difficulty with the conventional approach is that using a positive ion beam to perform mask scanning causes an excess of positive charge buildup on the mask, a phenomenon also referred to as the charge or charging effect. This positive charge buildup commonly reduces the effectiveness of the positive ion beam when performing mask scanning or repair.

One common problem is poor image quality, such as a faded or vague image, that results from the intensities of secondary ions and electrons being decreased as a result of the positive charge buildup. This is shown in FIG. 4A. The mask 402 has clear regions 404 and 406, and opaque regions 408 and 410. There should also be a clear spot 412 within the opaque region 408. However, it is not present, as indicated by the dotted-line nature of the spot 412, because the positive ion beam is not sufficiently efficient to neutralize the accumulated positive charge for isolated spots and patterns. This may require that a carbon film to be deposited to reduce the charging effect for the clear spot 412 to be properly formed.

Another common problem is that the charge buildup causes diversion of the positive ion beam during mask repair, which results in a loss of edge-placement accuracy because the ion bombardment position has shifted away from the desired location due to the diversion. This is shown in FIG. 4B. The mask 414 has a clear region 415 in which there are opaque regions 416 and 418. There should also be clear spots 420 in the region 416, and clear spots 422 and 424 in the region 418. However, because of the charge buildup, the clear spots 420, 422, and 424 have not been formed, as indicated by the dotted-line nature of the spots 420, 422, and 424.

To repair the mask, the ion beam is positioned over the desired locations of the spots 420, 422, and 424. However, the charge buildup diverts the beam. This causes the spot 420' to be created within a newly formed opaque region 426, instead of the spot 420 to be created within the opaque region 416. Similarly, beam diversion causes the spots 422' and 424' to be created within newly formed opaque regions 428 and 430, respectively, instead of the spots 422 and 424 to be created within the opaque 418.

Therefore, there is a need for image scanning and mask repair that does not exhibit these problems. Specifically, there is a need for image scanning that does not result in charge buildup, and that does not result in vague or faded images. There is also a need for preventing ion beam diversion during mask repair. For these and other reasons, there is a need for the present invention.

SUMMARY OF THE INVENTION

The invention relates to the use of dual-focused ion beams for semiconductor image scanning and mask repair. A mask, such as a photomask, is imaged with either a focused negative ion beam, such as a focused oxygen ion beam, or a focused positive ion beam, such as a focused gallium ion beam. Mask imaging is also referred to as image scanning. Clear or opaque defects in the mask are repaired with the other ion beam that was not used in imaging of the mask. For instance, image scanning is performed with the focused negative ion beam to neutralize potential charge buildup, and mask repair is performed with the focused positive ion beam. The negative and position ion beams may be focused by an apparatus having a negative ion mechanism supplying negative ions, a positive ion mechanism supplying positive ions, a filter to select the desired ratio of the negative to the positive ions, and an aiming mechanism to focus the ions onto the mask.

The invention provides for advantages not found within the prior art. Imaging scanning does not result in positive charge buildup, or such buildup is neutralized, when a negative ion beam is used for mask scanning. This results in an image that is not faded or vague. Furthermore, any necessary mask repair can be performed by a positive ion beam without diversion of the beam, due to the lack of positive charge buildup. When a positive ion beam is used for mask scanning, a negative ion beam is used for mask repair, so that repair can be performed without diversion of the beam that otherwise results from using a positive ion beam for mask repair where there is charge buildup from also using the positive ion beam for the mask scanning. Still other advantages, embodiments, and aspects of the invention will become apparent by reading the detailed description that follows, and by referencing the attached drawings.

DETAILED DESCRIPTION OF THE INVENTION

In the following detailed description of exemplary embodiments of the invention, reference is made to the accompanying drawings that form a part hereof, and in which is shown by way of illustration specific exemplary embodiments in which the invention may be practiced. These embodiments are described in sufficient detail to enable those skilled in the art to practice the invention. Other embodiments may be utilized, and logical, mechanical, and other changes may be made without departing from the spirit or scope of the present invention. The following detailed description is, therefore, not to be taken in a limiting sense, and the scope of the present invention is defined only by the appended claims.

Figure 1A:
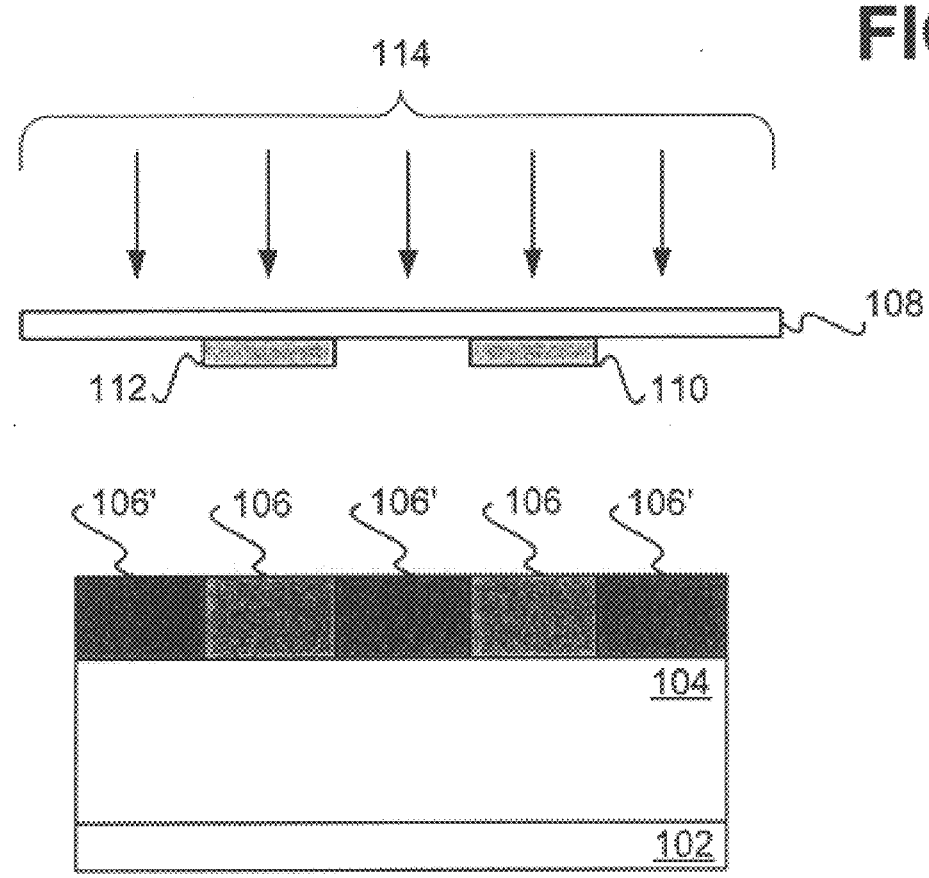
FIGS. 1A, 1B, 1C, and 1D are diagrams showing the process of patterning a layer deposited on a semiconductor wafer using a photomask.
Figure 1B:
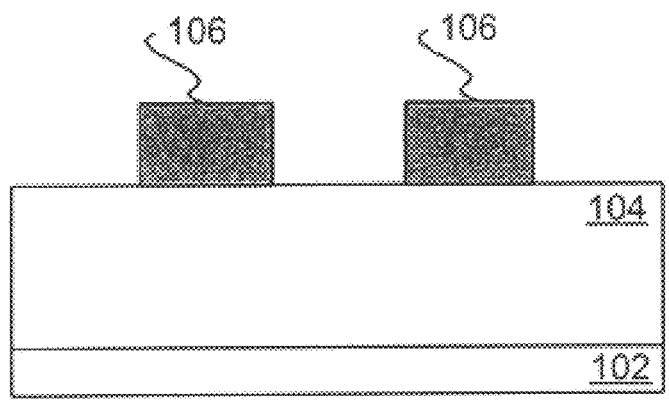
Figure 1C:
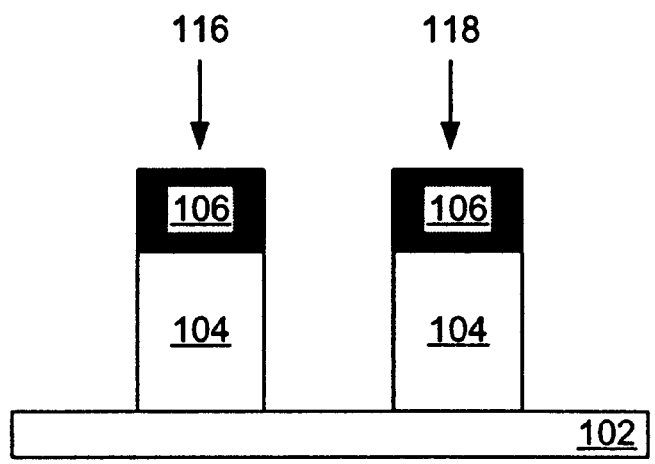
Figure 1D:
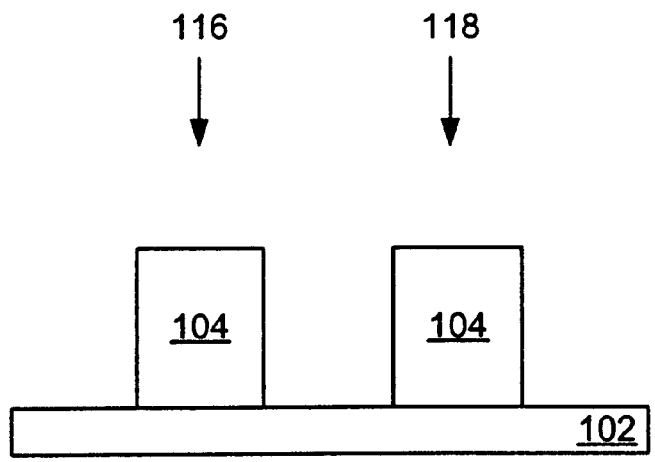
Figure 2A:
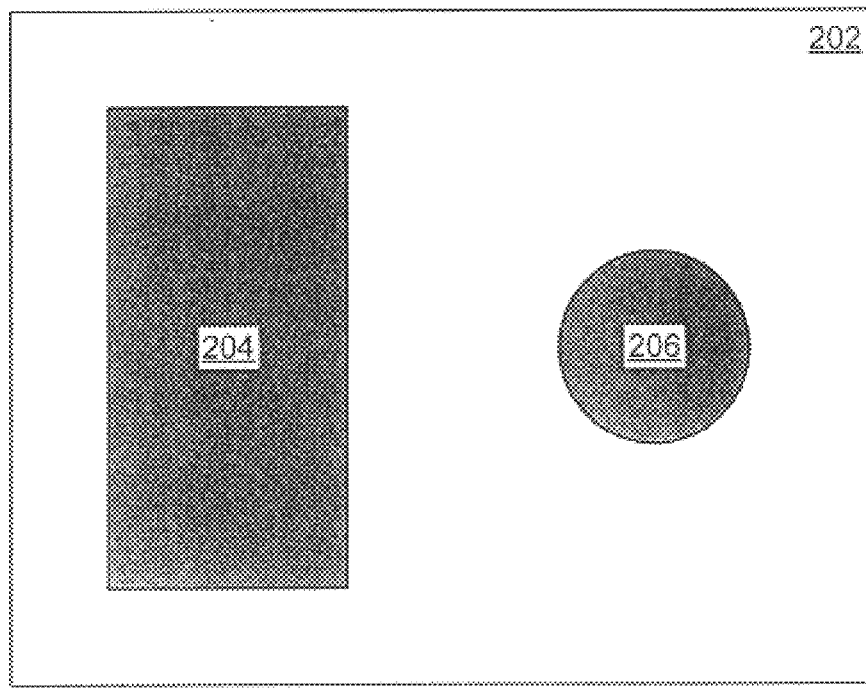
FIGS. 2A and 2B are diagrams of example defects that can occur in a photomask.
Figure 2B:
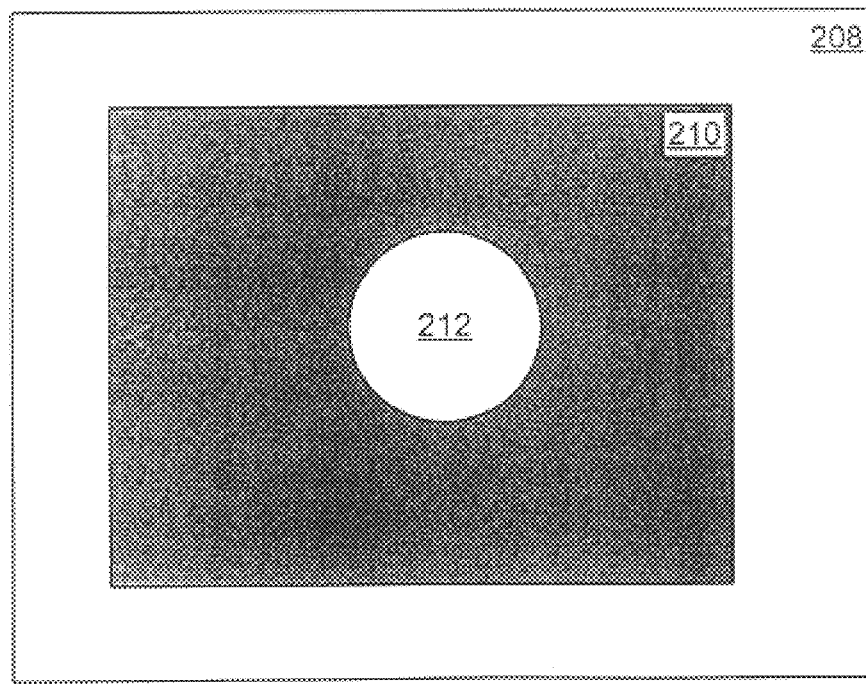
Figure 3:
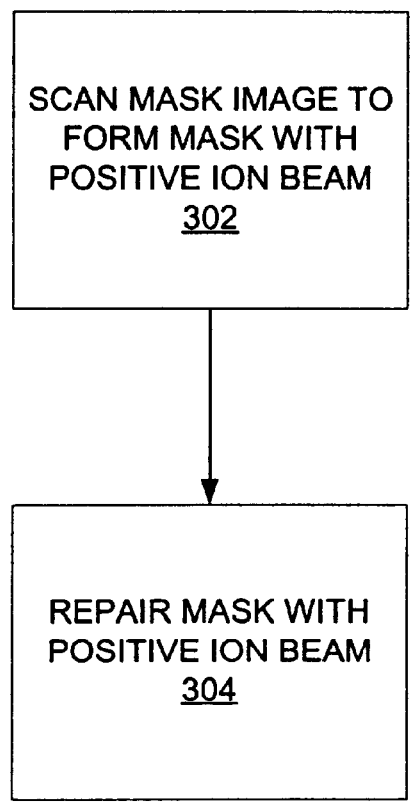
FIG. 3 is a flowchart of a method of a conventional approach to mask scanning and mask repair.
Figure 3:
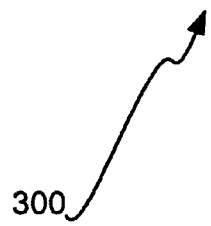
Figure 4A:
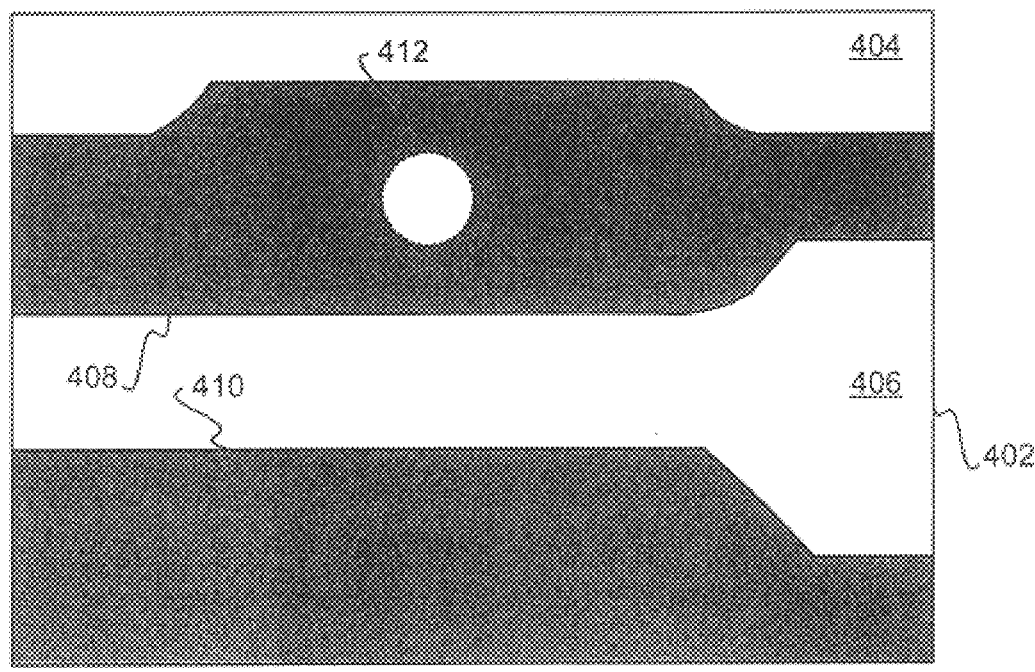
FIGS. 4A and 4B are diagrams showing an example vague or faded image and ion beam diversion, respectively, that can result from charge buildup.
Figure 4B:
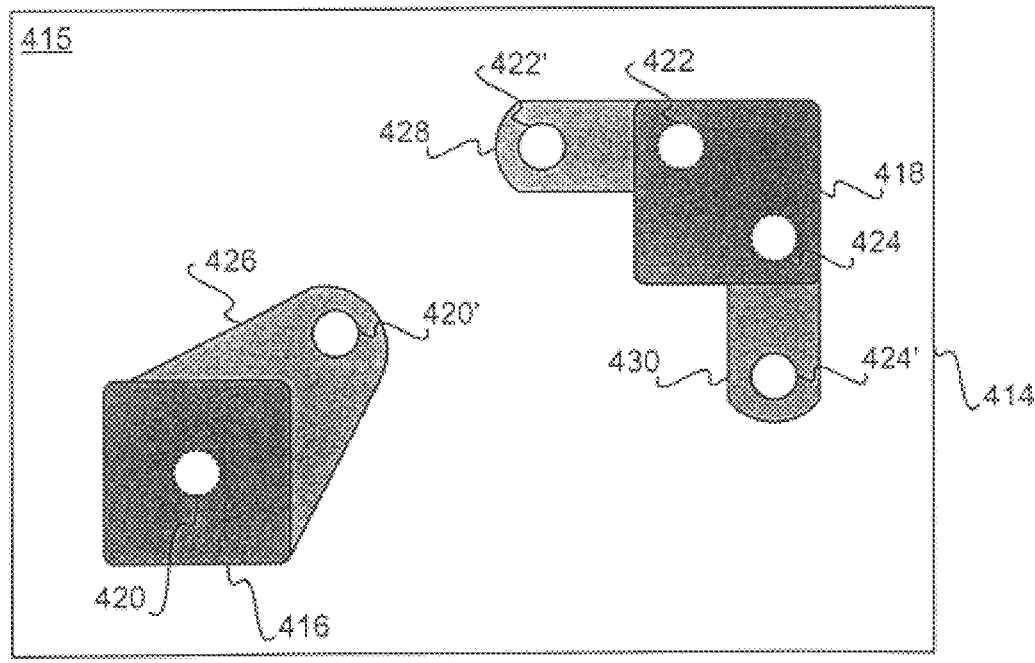
Figure 5A:
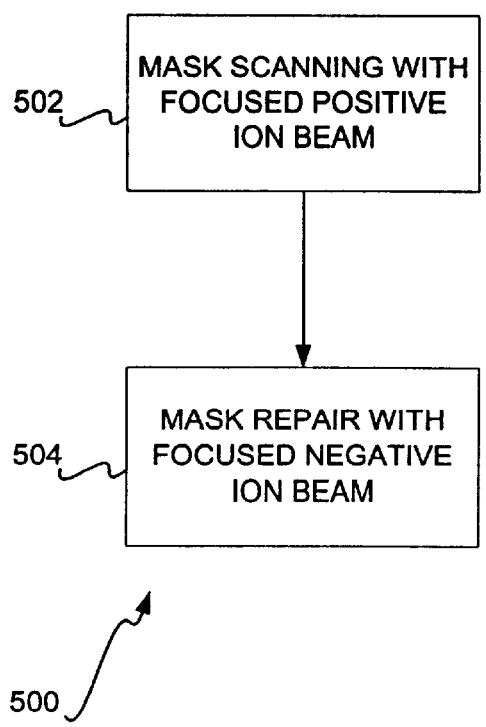
FIGS. 5A and 5B are flowchart of methods according to varying embodiments of the invention.
Figure 5B:
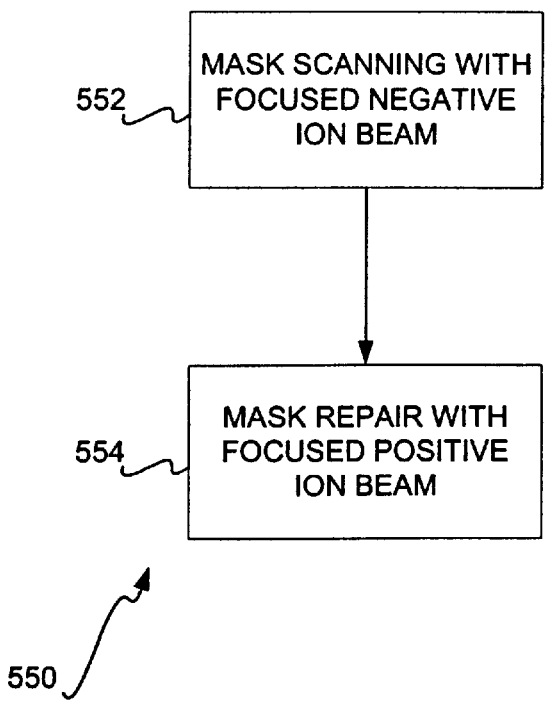

FIGS. 5A and 5B show methods 500 and 550, respectively, of different embodiments of the invention. In FIG. 5A, mask scanning, or mask imaging, is performed with a focused positive ion beam, to generally form a mask for use in semiconductor device manufacture (502). The focused positive ion beam may be a focused gallium ion beam. The mask may be a photomask, such as that which has clear regions that are glass, and opaque regions that are chromium. Next, any defects in the mask are repaired with a focused negative ion beam (504). The focused negative ion beam may be a focused oxygen ion beam. Clear defects, which are defects in which a given area is clear where it should be opaque, can be repaired by applying carbon to the defect, which makes the clear defect opaque. Opaque defects, which are defects in which a given area is opaque where it should be clear, can be repaired by removing the defect, which makes the opaque defect clear.

In FIG. 5B, mask scanning, or masking imaging, is instead performed with a focused negative ion beam, to generally form a mask for use in semiconductor device manufacture (552). The focused negative ion beam may be a focused negative ion beam. The focused negative ion beam neutralizes any potential charge buildup that would have otherwise resulted from using a focused positive ion beam. The mask may again be a photomask, such as that which has clear regions that are glass, and opaque regions that are chromium. Next, any defects in the mask are repaired with a focused positive ion beam (554). The focused positive ion beam may be a focused gallium ion beam. Clear defects can again be repaired by applying carbon to the defect, making the clear defect opaque. Opaque defects can again be repaired by removing the defect, which makes the opaque defect clear.

The use of one of a negative ion beam and a positive ion beam in the mask scanning process, and the use of the other of the negative ion beam and the positive ion beam in the mask repair process, provide embodiments of the invention with advantages over the prior art. Charge buildup either is neutralized, because a negative ion beam is initially used for mask imaging, or is substantially irrelevant, because a negative ion beam is used for mask repair. Without charge buildup, mask fading or vagueness is at least substantially less a problem in the mask scanning process. Furthermore, without charge buildup, mask repair is performed with minimal or no diversion of the ion beam, allowing for more accurate mask repairs to be accomplished.

Figure 6:
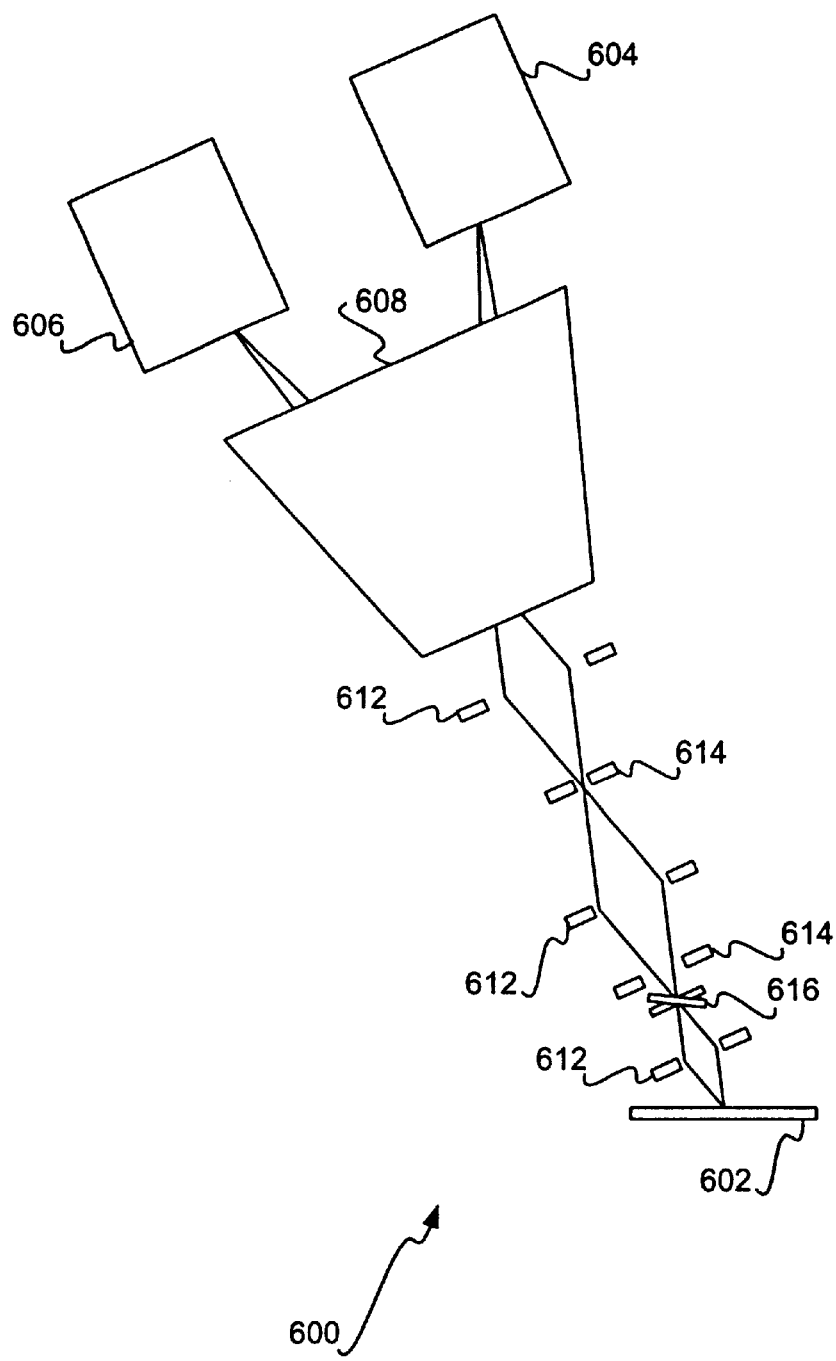
FIG. 6 is a diagram of a dual focused ion beam mask scanning and repair tool or apparatus, according to an embodiment of the invention.

FIG. 6 is a diagram showing a dual focused ion beam mask scanning and repair tool 600, or apparatus, according to an embodiment of the invention. The tool 600 may be used in conjunction with the methods 550 and 552 of FIGS. 5A and 5B, respectively, or they may be used in conjunction with other processes. The tool 600 is focused on a mask 602 for scanning and/or repair of the mask 602 by the tool 600. The tool 600 includes a gallium gun 604, which is generally a positive ion mechanism that supplies positive ions, such as gallium ions. The tool 600 also includes an oxygen duoplasmatron 606, which is generally a negative ion mechanism that supplies negative ions, such as oxygen ions. The mass filter 608 allows for the selection of the ratio of the negative ions to the positive ions to be used in the mask scanning and/or mask repair processes.

An aiming mechanism 610 of the tool 600 focuses the negative and the positive ions in the ratio provided by the filter 608 onto the mask 602, for mask scanning, mask repair, or both. The aiming mechanism 610 includes a number of electrostatic lenses 612, a number of apertures 614, and a number of raster steering deflectors 616 to accomplish its focusing. The electrostatic lenses 612 can use an electrical distribution to influence the ion beam in the same way that optical lenses affect a light beam. The apertures 614 serve to focus the ion beam, by decreasing the effective areas in which the beam can pass, such that errant ions may be blocked or otherwise travel through the apertures. The deflectors 616 further serve to focus the ion beam, by steering the path of the ion beam through deflection. The actual number of lenses 612, apertures 614, and deflectors 616 can vary depending on the embodiment of the invention. However, as shown in FIG. 6, there are three lenses 612, two apertures 614, and two deflectors 616.

Figure 7A:
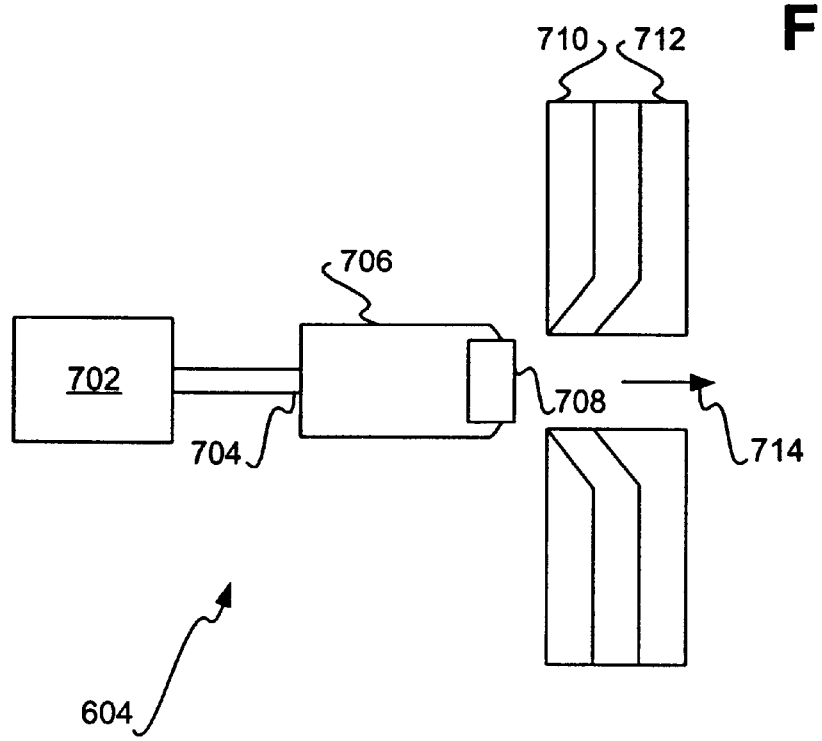
FIG. 7A is a diagram showing in more detail the gallium gun of FIG. 6, according to an embodiment of the invention.
Figure 7B:
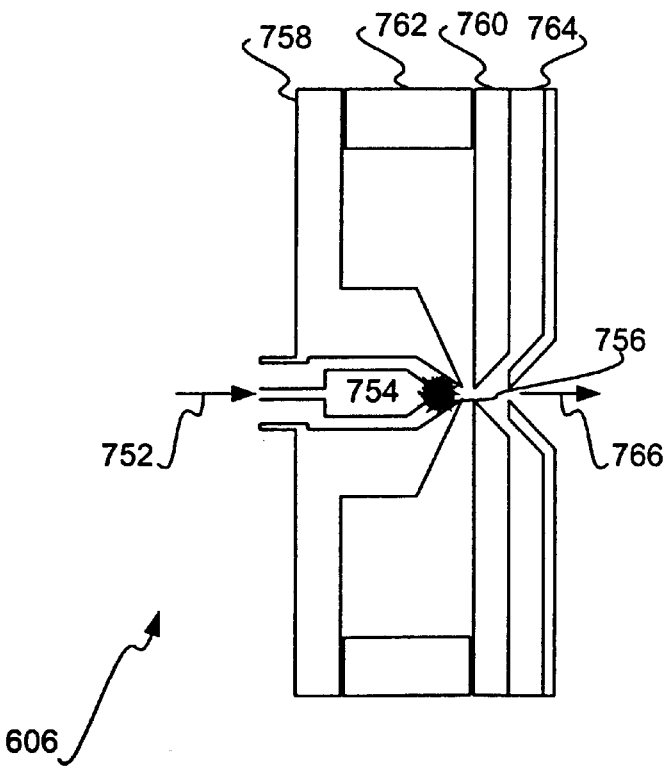
FIG. 7B is a diagram showing in more detail the oxygen duoplasmatron of FIG. 6, according to an embodiment of the invention.

FIGS. 7A and 7B show the gallium gun 604 and the oxygen duoplasmatron 606, respectively, in more detail, according to an embodiment of the invention. In FIG. 7A, the gallium gun 604 includes a gallium reservoir 702 connected by a tube 704 to an ejector 706 ending in a porous tungsten plug 708. Gallium ions ejected through the plug 708 of the ejector 706 from the gallium reservoir 702 are excited by a focus electrode 710 and an extraction electrode 712, such that they are emitted as indicated by the arrow 714.

In FIG. 7B, the oxygen duoplasmatron 606 has oxygen gas injected into a cathode 754 thereof, as indicated by the arrow 752. The cathode 754 helps to excite the oxygen gas into plasma, as indicated by the reference number 756, such that oxygen ions are emitted as indicated by the arrow 766. Surrounding and/or attached to the cathode 754 are an intermediate electrode 758, anode 760, wall 762, and extraction electrode 764. The oxygen duoplasmatron 606 of FIG. 7B may be used in the same or different embodiment of the invention as the gallium gun 604 of FIG. 7A is used.

It is noted that, although specific embodiments have been illustrated and described herein, it will be appreciated by those of ordinary skill in the art that any arrangement is calculated to achieve the same purpose may be substituted for the specific embodiments shown. This application is intended to cover any adaptations or variations of the present invention. Therefore, it is manifestly intended that this invention be limited only by the claims and equivalents thereof.

What is claimed is:

1. A method comprising:
   imaging a mask for use in semiconductor device manufacture with one of a focused negative ion beam and a focused positive ion beam; and
   repairing one or more defects in the mask with another of the focused negative ion beam and the focused positive ion beam.

2. The method of claim 1, wherein imaging the mask comprises mask scanning.

3. The method of claim 1, wherein the mask comprises one or more clear regions and one or more opaque regions.

4. The method of claim 3, wherein the one or more clear regions are glass and the one or more opaque regions are chromium.

5. The method of claim 1, wherein the focused negative ion beam is a focused oxygen ion beam.

6. The method of claim 1, wherein the focused positive ion beam is a focused gallium ion beam.

7. The method of claim 1, wherein the mask is a photomask.

8. The method of claim 1, wherein repairing the one or more defects comprises repairing a clear defect by applying carbon to make the clear defect opaque.

9. The method of claim 1, wherein repairing the one or more defects comprises repairing an opaque defect by removing the opaque defect to make the opaque defect clear.

10. A method comprising:
    scanning an image of a mask for use in semiconductor device manufacture with a focused negative ion beam to neutralize potential charge buildup; and
    repairing one or more defects in the mask with a focused positive ion beam.

11. The method of claim 10, wherein scanning the image of the mask comprises mask imaging.

12. The method of claim 10, wherein the mask comprises one or more clear regions that are glass and one or more opaque regions that are chromium.

13. The method of claim 10, wherein the focused negative ion beam is a focused oxygen ion beam and the focused positive ion beam is a focused gallium ion beam.

14. The method of claim 10, wherein repairing the one or more defects comprises repairing a clear defect by applying carbon to make the clear defect opaque.

15. The method of claim 10, wherein repairing the one or more defects comprises repairing an opaque defect by removing the opaque defect to make the opaque defect clear.

* * * * *